(12) United States Patent
Maeda et al.

(10) Patent No.: US 8,772,643 B2
(45) Date of Patent: Jul. 8, 2014

(54) MULTILAYER WIRING SUBSTRATE, AND METHOD OF MANUFACTURING THE SAME

(75) Inventors: Shinnosuke Maeda, Nagoya (JP); Tetsuo Suzuki, Niwa-gun (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 333 days.

(21) Appl. No.: 13/028,545

(22) Filed: Feb. 16, 2011

(65) Prior Publication Data

US 2011/0198114 A1    Aug. 18, 2011

(30) Foreign Application Priority Data

Feb. 16, 2010  (JP) .................................. 2010-31864

(51) Int. Cl.
*H05K 1/09*    (2006.01)
(52) U.S. Cl.
USPC ........... 174/257; 174/261; 174/262; 174/263; 174/264; 174/267; 361/760; 361/764; 361/795; 257/432; 257/678; 257/737; 257/774; 257/784; 385/14
(58) Field of Classification Search
USPC .......... 174/257, 260–264, 267; 361/760, 764, 361/795; 257/432, 678, 737, 774, 784; 385/14
See application file for complete search history.

(56) References Cited

U.S. PATENT DOCUMENTS

| | | | |
|---|---|---|---|
| 6,674,017 B1 * | 1/2004 | Yamasaki et al. ............. | 174/262 |
| 7,060,604 B2 | 6/2006 | Kata et al. | |
| 7,152,314 B2 | 12/2006 | Shuto et al. | |
| 7,233,066 B2 | 6/2007 | Kata et al. | |
| 7,915,088 B2 | 3/2011 | Kobayashi et al. | |
| 8,129,828 B2 * | 3/2012 | Maeda ........................ | 257/678 |
| 8,233,289 B2 * | 7/2012 | Maeda et al. ................ | 361/795 |
| 8,237,270 B2 | 8/2012 | Kobayashi et al. | |

(Continued)

FOREIGN PATENT DOCUMENTS

| JP | 2002-290022 A | 10/2002 |
|---|---|---|
| JP | 2003-133711 A | 5/2003 |

(Continued)

OTHER PUBLICATIONS

KIPO, Office Action issued in corresponding application 10-2011-0011913, issued Nov. 12, 2012.

(Continued)

*Primary Examiner* — Xiaoliang Chen
(74) *Attorney, Agent, or Firm* — Stites & Harbison PLLC; Jeffrey A. Haeberlin; Nicolo Davidson

(57) ABSTRACT

A plurality of openings are formed in a resin insulation layer on a top surface side of a wiring laminate portion, and a plurality of openings are formed in a resin insulation layer on a bottom surface side thereof. A plurality of connection terminals are disposed to correspond to the openings. Peripheral portions of terminal outer surfaces of the connection terminals are covered by the resin insulation layer on the top surface side, and peripheral portions of terminal outer surfaces of the connection terminals are covered by the resin insulation layer on the bottom surface side. Each of the second-main-surface-side connection terminals has a concave portion at the center of the terminal outer surface, and the deepest portion of the concave portion is located on the interior side in relation to the peripheral portion of the terminal outer surface.

7 Claims, 13 Drawing Sheets

(56) References Cited

U.S. PATENT DOCUMENTS

| | | |
|---|---|---|
| 8,362,364 B2 * | 1/2013 | Asano et al. .................. 174/260 |
| 8,389,871 B2 * | 3/2013 | Maeda et al. .................. 174/261 |
| 2003/0178229 A1 * | 9/2003 | Toyoda et al. ................. 174/261 |
| 2004/0026781 A1 * | 2/2004 | Nakai ........................... 257/737 |
| 2004/0053489 A1 | 3/2004 | Kata et al. |
| 2004/0211751 A1 | 10/2004 | Shuto et al. |
| 2004/0212030 A1 * | 10/2004 | Asai .............................. 257/432 |
| 2005/0185880 A1 * | 8/2005 | Asai ............................... 385/14 |
| 2005/0280130 A1 * | 12/2005 | Nakai ............................ 257/678 |
| 2006/0012967 A1 * | 1/2006 | Asai et al. ..................... 361/764 |
| 2006/0189125 A1 | 8/2006 | Kata et al. |
| 2006/0202357 A1 * | 9/2006 | Kanagawa et al. ........... 257/784 |
| 2006/0263003 A1 * | 11/2006 | Asai et al. ...................... 385/14 |
| 2007/0095466 A1 * | 5/2007 | Tsuda ........................ 156/272.2 |
| 2007/0124924 A1 * | 6/2007 | Nakamura ....................... 29/830 |
| 2008/0118199 A1 * | 5/2008 | Asai et al. ....................... 385/14 |
| 2008/0190658 A1 * | 8/2008 | Toyoda et al. ................. 174/263 |
| 2008/0258300 A1 * | 10/2008 | Kobayashi et al. ........... 257/737 |
| 2008/0308308 A1 | 12/2008 | Kobayashi |
| 2009/0065243 A1 * | 3/2009 | Nakai ........................... 174/257 |
| 2009/0242261 A1 * | 10/2009 | Takenaka et al. ............. 174/262 |
| 2010/0208437 A1 * | 8/2010 | Maeda et al. .................. 361/760 |
| 2011/0139502 A1 | 6/2011 | Kobayashi et al. |
| 2011/0155438 A1 * | 6/2011 | Ito et al. ........................ 174/261 |
| 2011/0155443 A1 * | 6/2011 | Maeda et al. .................. 174/267 |
| 2011/0156272 A1 * | 6/2011 | Maeda et al. .................. 257/774 |
| 2011/0200788 A1 * | 8/2011 | Maeda et al. .................. 428/139 |
| 2011/0232951 A1 * | 9/2011 | Maeda et al. .................. 174/257 |

FOREIGN PATENT DOCUMENTS

| | | |
|---|---|---|
| JP | 2004-111536 A | 4/2004 |
| JP | 2004-111544 | 4/2004 |
| JP | 2007-158174 | 6/2007 |
| JP | 2008-251702 A | 10/2008 |
| JP | 2008-263125 A | 10/2008 |
| JP | 2009-224415 A | 10/2009 |
| JP | 2009-239224 A | 10/2009 |
| KR | 10-2008-0092851 | 10/2008 |
| TW | 200421953 A | 10/2004 |

OTHER PUBLICATIONS

JPO, Office Action issued in corresponding Japanese application No. 2010-031864, mailed Jun. 4, 2013.

State Intellectual Property Office of the People's Republic of China, Office Action issued in corresponding application 201110040311.7, issued May 6, 2013.

Taiwan Patent Office, Notification for the Opinion of Examination, issued in corresponding Taiwanese Application Serial No. 100104842, mailing date Feb. 25, 2014.

* cited by examiner

MULTILAYER WIRING SUBSTRATE, AND METHOD OF MANUFACTURING THE SAME

CROSS-REFERENCE TO RELATED APPLICATIONS

The present application claims priority to Japanese Patent Application No. 2010-31864, which was filed on Feb. 16, 2010, the disclosure of which is incorporated by reference in its entirety.

BACKGROUND OF THE INVENTION

1. Field of the Invention

The present invention relates to a multilayer wiring substrate having a laminate structure in which a plurality of resin insulation layers made primarily of the same resin insulation material, and a plurality of conductive layers are laminated alternately in multilayer arrangement, and not having a so-called substrate core in a final product, the substrate core carrying build-up layers successively formed on opposite surfaces thereof. The present invention also relates to a method of manufacturing such a multilayer wiring substrate.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate) formed by impregnating reinforcement fiber with resin. Through utilization of rigidity of the substrate core, resin insulation layers and conductive layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed (refer to, for example, Patent Documents 1 and 2). The multilayer wiring substrates described in Patent Documents 1 and 2 do not use a substrate core, which is relatively thick, thereby reducing the overall wiring length. Thus, the transmission loss of high-frequency signals is lowered, whereby a semiconductor integrated circuit device can be operated at high speed.

In the manufacturing method disclosed in Patent Document 1, a metal foil is disposed one side of a provisional substrate, and a plurality of conductive layers and a plurality of resin insulation layers are alternately stacked on the metal foil to thereby form a build-up layer. Subsequently, the metal foil is separated from the provisional substrate so as to obtain a structure in which the build-up layer is formed on the metal foil. The surface of the outermost layer (the surface of a resin insulation layer and the surfaces of a plurality of connection terminals) is exposed by means of removing the metal foil through etching, whereby a multilayer wiring substrate is manufactured.

Patent Document 1 also discloses a multilayer wiring substrate in which a solder resist film is formed on the build-up layer as the outermost layer thereof. Notably, openings are formed in the solder resist film so as to expose the surfaces of IC-chip connection terminals. In a multilayer wiring substrate disclosed in Patent Document 2 as well, a solder resist film is formed, as the outer most layer, on the side of the wiring substrate where an IC chip is mounted, and openings are formed in the solder resist film so as to expose the top surfaces of IC-chip connection terminals. The solder resist film is made primarily of a hardened photocurable resin insulation material. The openings of the solder resist film are formed through exposure and development performed in a state in which a predetermined mask is disposed on the solder resist film. Subsequently, solder bumps are formed on the top surfaces of the IC-chip connection terminals exposed within the openings of the solder resist film, and an IC chip is mounted via the solder bumps.

Patent Documents

Patent Document 1: Japanese Patent Application Laid-open (kokai) No. 2007-158174. Patent Document 2: Japanese Patent Application Laid-open (kokai) No. 2004-111544.

BRIEF SUMMARY OF THE INVENTION

Incidentally, the above-mentioned Patent Document 1 discloses a multilayer wiring substrate in which the surfaces of connection terminals (e.g., motherboard connection terminals to be connected to a motherboard) having a relatively large area are formed such that the surfaces become flush with the outermost resin insulation layer. In this multilayer wiring substrate, in some cases, a stress acts at the boundary between each motherboard connection terminal and the resin insulation layer. Therefore, the disclosed multilayer wiring substrate has a problem in that, as shown in FIG. 28, cracks 103 are generated at the boundary between each motherboard connection terminal 101 and a resin insulation layer 102 in such a manner that the cracks 103 extend from the boundary through the resin insulation layer 102.

In order to solve such a problem, the multilayer wiring substrate may be manufactured such that a solder resist film is formed to cover a peripheral portion of the outer surface of each motherboard connection terminal. Thus, the stress acting at the boundary between each motherboard connection terminal and the resin insulation layer can be reduced. However, when a solder resist film is formed as the outermost layer of the multilayer wiring substrate, due to a difference in coefficient of thermal expansion between the solder resist film and inner resin insulation layers, the substrate warps in accordance with the difference in coefficient of thermal expansion. In this case, since a structure (e.g., a reinforcing plate or the like) is additionally required so as to restrain the warpage, the manufacturing cost of the multilayer wiring substrate increases.

The present invention has been conceived in view of the above problems, and an object of the invention is to provide a highly reliable multilayer wiring substrate which is free from generation of cracks in a resin insulation layer.

According to an aspect of the invention, a multilayer wiring substrate includes a laminate structure in which a plurality of resin insulation layers made primarily of a same resin insulation material, and a plurality of conductive layers are laminated alternately in multilayer arrangement, a plurality of first-main-surface-side connection terminals being disposed on a first main surface side of the laminate structure, a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side of the laminate structure or the second main surface side of the laminate structure. The plurality of resin insulation layers are formed of a hardened resin insulation material that is not photocurable. A plurality of first openings are formed in an outermost resin insulation layer on the first main surface side of the laminate structure. The plurality of first-main-surface-side connection terminals include terminal outer surfaces and are disposed to correspond to the plurality of first openings, and peripheral portions of the terminal outer surfaces are covered by the outermost resin insulation layer on the first main surface side of the laminate structure. A plurality of second openings are formed in an outermost resin insulation layer on the second main surface side of the laminate structure. The plurality of second-main-surface-side connection terminals include terminal outer surfaces and are disposed to correspond to the plurality of second openings, and peripheral portions of the terminal outer surfaces are covered by the outermost resin insulation layer on the second main surface side of the laminate structure. Each of the plurality of second-main-surface-side connection terminals has a concave portion at a center portion of each of the terminal outer surfaces.

According to this aspect, the multilayer wiring substrate is formed such that a plurality of resin insulation layers made primarily of the same resin insulation material, and a plurality of conductive layers are laminated alternately, and assumes the form of a coreless wiring substrate having no substrate core. In this multilayer wiring substrate, the plurality of resin insulation layers which constitute the laminate structure are formed of the same build-up material made primarily of a hardened resin insulation material that is not photocurable. In this case, the influence of a difference in thermal expansion coefficient in the laminate structure can be mitigated, as compared with the case where the outermost resin insulation layers are formed of a different resin insulation material. As a result, warpage of the multilayer wiring substrate can be restrained. Furthermore, since the outermost resin insulation layers, in which the connection terminals are formed, are formed of the same build-up material having excellent electrical insulation performance as that used to form the inner resin insulation layers, the interval between the connection terminals can be narrowed, so that the multilayer wiring substrate can be further integrated. Also, the plurality of first openings are formed in the outermost resin insulation layer exposed on the first main surface side of the laminate structure, and the plurality of the first-main-surface-side connection terminals are disposed to correspond to these first openings. Peripheral portions of the terminal outer surfaces of the first-main-surface-side connection terminals are covered by the corresponding outermost resin insulation layer. That is, peripheral portions of the first-main-surface-side connection terminals are buried (embedded) in the corresponding outermost resin insulation layer. Accordingly, the strength of the first-main-surface-side connection terminals can be increased sufficiently. Furthermore, the plurality of second openings are formed in the outermost resin insulation layer exposed on the second main surface side of the laminate structure, and the plurality of the second-main-surface-side connection terminals are disposed to correspond to these second openings. Peripheral portions of the terminal outer surfaces of the second-main-surface-side connection terminals are covered by the corresponding outermost resin insulation layer. That is, peripheral portions of the second-main-surface-side connection terminals are buried (embedded) in the corresponding outermost resin insulation layer. Accordingly, the strength of the second-main-surface-side connection terminals can be increased sufficiently. When the connection terminals are formed in this manner, stress acting at the boundary between each of the connection terminals and the resin insulation layer can be mitigated. Therefore, the possibility of generation of cracks in the resin insulation layers decreases. Moreover, each of the second-main-surface-side connection terminals has a concave portion formed at the center of the terminal outer surface thereof. In particular, when a hemispherical concave portion is formed on the terminal outer surface of each second-main-surface-side connection terminal, the concentration of stress at an end portion of the second-main-surface-side connection terminal is mitigated, whereby generation of cracks in the corresponding resin insulation layer can be prevented, and reliability is improved.

Preferably, the concave portion of each of the terminal outer surfaces is formed such that a deepest portion of the concave portion is located on the inner layer (interior) side in relation to the peripheral portion of each of the terminal outer surfaces. Since the second-main-surface-side connection terminals formed in this manner increase the area of contact between solder and the terminal outer surface, the strength of solder connection can be increased.

Preferably, each of the plurality of second-main-surface-side connection terminals further includes an inner surface having a peripheral edge, and the peripheral edge is rounded. When this configuration is employed, the concentration of stress at an edge portion of the terminal inner surface is avoided. Therefore, the possibility of generation of cracks in the resin insulation layer decreases, and the multilayer wiring substrate has an improved reliability as compared with conventional ones. Notably, the second-main-surface-side connection terminals may be provided on the main surface to which a motherboard is connected, or provided on the opposite main surface; i.e., the main surface onto which an IC chip is mounted.

Preferably, the first-main-surface-side connection terminals include IC-chip connection terminals, to which an IC chip is to be connected, and passive-component connection terminals, to which a passive component is to be connected and which are greater in area than the IC-chip connection terminals; and the second-main-surface-side connection terminals include motherboard connection terminals, to which a motherboard is to be connected and which are greater in area than the IC-chip connection terminals and the passive-component connection terminals, are provided on the second main surface side as the second-main-surface-side connection terminals. When this configuration is employed, on the first main surface side of the laminate structure, an IC chip can be reliably connected to the IC-chip connection terminals whose area is small, and a passive component can be reliably connected to the passive-component connection terminals whose area is large. Moreover, on the second main surface side of the laminate structure, the motherboard connection terminals can be reliably connected to a motherboard.

Alternatively, the first-main-surface-side connection terminals may include IC-chip connection terminals, to which an IC chip is connected; and the second-main-surface-side connection terminals may include passive-component connection terminals, to which a passive component is to be connected and which are greater in area than the IC-chip connection terminals, and motherboard connection terminals, to which a motherboard is to be connected and which are greater in area than the IC-chip connection terminals and the passive-component connection terminals. When this configuration is employed, on the first main surface side of the laminate structure, an IC chip can be reliably connected to the IC-chip connection terminals. Moreover, on the second main surface side of the laminate structure, a passive component can be reliably connected to the passive-component connection terminals, and the motherboard connection terminals can be reliably connected to a motherboard.

The via conductors formed in the plurality of resin insulation layers may be shaped such that their diameters increase in a direction from the second main surface side to the first main surface side. By contrast, the via conductors formed in the plurality of resin insulation layers may also be shaped such that their diameters increase in a direction from the first main surface side to the second main surface side. Through employment of this diametral feature, a coreless wiring substrate having no substrate core can be reliably manufactured.

Each of the motherboard connection terminals or each of the IC-chip connection terminals and the passive-component connection terminals may comprise a copper layer covered with a plating layer comprised of a material other than copper. Alternatively, each of the motherboard connection terminals, the IC-chip connection terminals, and the passive-component connection terminals may comprise a copper layer covered with a plating layer formed of a material other than copper. In particular, it is preferred that each of the IC-chip connection terminals whose area is small has a structure in which only the upper surface of a copper layer which mainly forms the connection terminals is covered with a plating layer formed of a material other than copper. When this configuration is employed, a solder bump formed on the upper surface of each connection terminal can be prevented from bulging laterally. Therefore, solder bumps can be formed on the upper surfaces of the connection terminals at a fine pitch.

Preferred examples of the material used to form the resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin.

Notably, in the present invention, "a plurality of resin insulation layers made primarily of the same resin insulation material" may be a plurality of resin insulation layers which differ in additive, such as the above-mentioned organic fiber, which is mixed with, for example, thermo setting resin, if the resin insulation layers are mainly formed of the same thermo setting resin.

According to another aspect of the invention, a method of manufacturing a multilayer wiring substrate including a laminate structure in which a plurality of resin insulation layers made primarily of a same resin insulation material, and a plurality of conductive layers are laminated alternately in multilayer arrangement, a plurality of first-main-surface-side connection terminals being disposed on a first main surface side of the laminate structure, a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side of the laminate structure or the second main surface side of the laminate structure. The method includes: a base-material preparation step of preparing a base material on which a metal foil is separably laminated; and an insulation-layer/conductor-portion forming step. The insulation-layer/conductor-portion forming step includes: a step of laminating on the metal foil a build-up material made primarily of a resin insulation material that is not photocurable, to thereby form an outermost resin insulation layer on the second main surface side of the laminate structure, a step of forming openings in the outermost resin insulation layer, and a step of forming a metal conductor portion in each of the openings and on a corresponding portion of the outermost resin insulation layer around each of the openings. The method further includes a build-up step including a step of laminating the plurality of resin insulation layers made primarily of the same resin insulation material, and a plurality of conductive layers alternately in multilayer arrangement, to thereby form the laminate structure, and a step of forming the first-main-surface-side connection terminals on the first main surface side of the laminate structure. The method also includes a base-material removing step of, after the build-up step, removing the base material to thereby expose the metal foil, and a connection-terminal forming step of removing the metal foil and at least a portion of each metal conductor portion, to thereby form a concave portion in each of the plurality of second-main-surface-side connection terminals.

According to the aspect mentioned above, the second-main-surface-side connection terminals can be reliably formed such that a peripheral portion of the terminal outer surface of each second-main-surface-side connection terminal is covered by the corresponding outermost resin insulation layer. Moreover, the concave portion is formed on the terminal outer surface of each second-main-surface-side connection terminal such that the deepest portion of the concave portion is located on the inner layer side in relation to the peripheral portion of the terminal outer surface. When the second-main-surface-side connection terminals are formed in this manner, the stress acting at the boundary between each second-main-surface-side connection terminal and the corresponding resin insulation layer can be mitigated, whereby the possibility of generation of cracks in the resin insulation layer decreases. Furthermore, since the area of contact between solder and the terminal outer surface increases, the strength of solder connection can be increased. Moreover, in the manufacturing method of the present invention, since the second-main-surface-side connection terminals are not required to be formed in a predetermined pattern after the build-up step, the multilayer wiring substrate can be manufactured relatively easily.

The step of forming openings in the outermost resin insulating layer may be performed after the step of laminating on the metal foil a build-up material, and may include a step of performing laser drilling on the outermost resin insulation layer on the second main surface side to thereby form the openings, the openings for exposing portions of the metal foil. The method may further include, after the step of performing laser drilling, a step of forming a plating resist film on the outermost resin insulation layer on the second main surface, and a step of forming, at positions corresponding to the openings, additional openings in the plating resist film which are greater in area than the openings. The step of forming the metal conductor portion may be performed after the steps of forming a plating resist film and forming additional openings, and may further include: a step of performing electro plating so as to form the metal conductor portions in each of the openings and the additional openings; and a step of removing the plating resist film. In this case, the metal conductor portions, which are to be used as the second-main-surface-side connection terminals, can be formed reliably.

According to another aspect of the invention, a method of manufacturing a multilayer wiring substrate as described above includes: a base-material preparation step of preparing a base material on which a metal foil is separably laminated; and an insulation-layer/conductor-portion forming step. The insulation-layer/conductor-portion forming step includes: a step of performing copper plating so as to form metal-conductor-portion lower layers, which partially constitute the metal conductor portions, on the metal foil; a step of laminating on the metal foil and the metal-conductor-portion lower layers a build-up material made primarily of a resin insulation material that is not photocurable, to thereby form an outermost resin insulation layer on the second main surface side of the laminate structure; a step of exposing the upper end surfaces of the metal-conductor-portion lower layers from the outermost resin insulation layer on the second main surface side; a step of forming a plating resist film on the outermost resin insulation layer on the second main surface; a step of forming openings at positions corresponding to the upper end surfaces of the metal-conductor-portion lower layers, the openings having area greater than an area of the upper end surfaces; a step of performing copper plating so as to form metal-conductor-portion upper layers, which partially constitute the metal conductor portions in the openings; and a step of removing the plating resist film. This aspect of the invention also includes a build-up step, a base-material removing step, and a connection-terminal forming step as described above with respect to the previous aspect of the invention. In this case as well, the metal conductor portions, which are to be used as the second-main-surface-side connection terminals, can be formed reliably.

Other features and advantages of the invention will be set forth in, or apparent from, the detailed description of exemplary embodiments of the invention found below.

DETAIL DESCRIPTION OF EXEMPLARY
EMBODIMENTS OF THE INVENTION

First Embodiment

Figure 1:
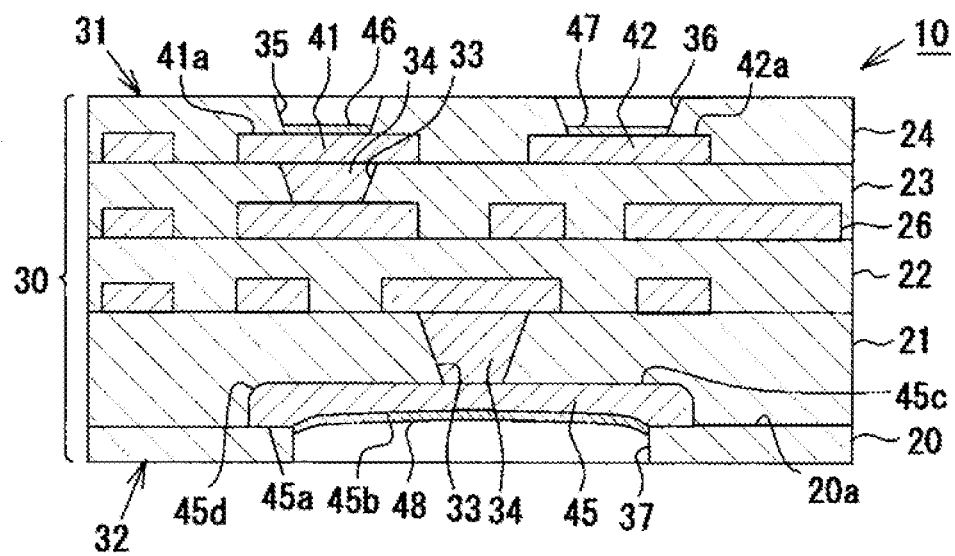
FIG. 1 is a sectional view schematically showing the structure of a multilayer wiring substrate according to a first embodiment.
Figure 2:
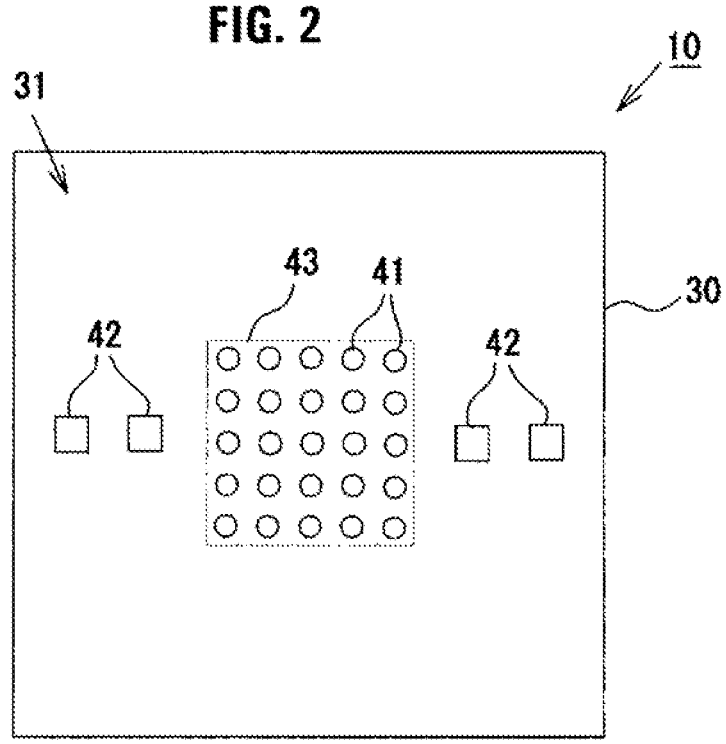
FIG. 2 is a plan view schematically showing the structure of the multilayer wiring substrate according to the first embodiment.
Figure 3:
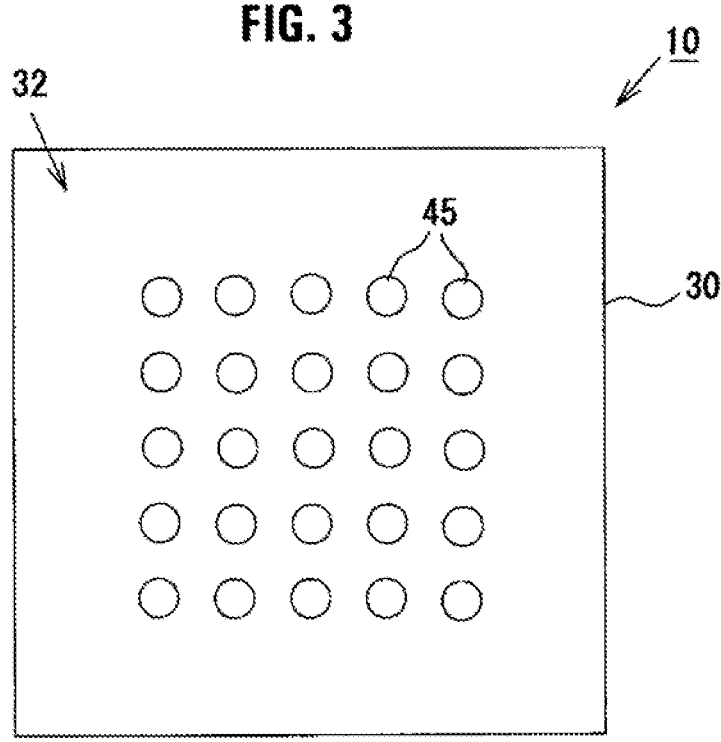
FIG. 3 is a plan view schematically showing the structure of the multilayer wiring substrate according to the first embodiment.

A multilayer wiring substrate according to a first embodiment of the present invention will next be described in detail with reference to the drawings. FIG. 1 is an enlarged sectional view schematically showing the structure of the multilayer wiring substrate of the present embodiment. FIG. 2 is a plan view of the multilayer wiring substrate as viewed from the top surface side. FIG. 3 is a plan view of the multilayer wiring substrate as viewed from the bottom surface side.

As shown in FIG. 1, a multilayer wiring substrate 10 is a coreless wiring substrate having no substrate core and has a multilayer wiring laminate portion 30 (laminate structure) in which a plurality of resin insulation layers 20, 21, 22, 23, and 24 made primarily of the same resin insulation material, and a plurality of conductive layers 26 made of copper are laminated alternately. The resin insulation layers 20 to 24 are formed of a build-up material made primarily of a hardened resin insulation material that is not photocurable; specifically, a hardened thermosetting epoxy resin. In the multilayer wiring substrate 10, a plurality of connection terminals 41 and 42 (first-main-surface-side connection terminals) are disposed on one side (first main surface side) of the wiring laminate portion 30 where a top surface 31 (first main surface) thereof is present.

As shown in FIGS. 1 and 2, in the multilayer wiring substrate 10 of the present embodiment, the plurality of connection terminals 41 and 42 disposed on the top surface 31 side of the wiring laminate portion 30 are IC-chip connection terminals 41 to which an IC chip is connected, and capacitor connection terminals 42 to which chip capacitors are connected. On the top surface 31 side of the wiring laminate portion 30, the plurality of IC-chip connection terminals 41 are arrayed in a chip mounting region 43 provided at a central portion of the multilayer wiring substrate 10. The capacitor connection terminals 42 are greater in area than the IC-chip connection terminals 41 and are disposed externally of the chip mounting region 43.

Meanwhile, as shown in FIGS. 1 and 3, on the other side (second main surface side) of the wiring laminate portion 30 where a bottom surface 32 (second main surface) thereof is present, a plurality of connection terminals 45 (motherboard connection terminals serving as second-main-surface-side connection terminals) for LGA (land grid array) to which a motherboard is connected are arrayed. The motherboard connection terminals 45 are greater in area than the IC-chip connection terminals 41 and the capacitor connection terminals 42 on the top surface 31 side.

Via holes 33 and filled-via conductors 34 are provided in the resin insulation layers 21, 22, 23, and 24. The via conductors 34 are shaped such that their diameters increase in the same direction (in FIG. 1, in the direction from the bottom surface toward the top surface). The via conductors 34 electrically interconnect the conductive layers 26, the IC-chip connection terminals 41, the capacitor connection terminals 42, and the motherboard connection terminals 45.

A plurality of openings 35 and 36 (first openings) are formed in the resin insulation layer 24 (outermost resin insulation layer on the first main surface side of the laminate structure) which is exposed to the outside and serves as an outermost layer on the top surface 31 side of the wiring laminate portion 30. The IC-chip connection terminals 41 and the capacitor connection terminals 42 are disposed to correspond to these openings 35 and 36.

Specifically, the IC-chip connection terminals 41 are disposed within the openings 35 such that their terminal outer surfaces 41a are lower in height than the outer surface of the resin insulation layer 24. Peripheral portions of the terminal outer surfaces 41a are covered by the outermost resin insulation layer 24. That is, the IC-chip connection terminals 41 are greater in size than the openings 35, and peripheral portions of the terminal outer surfaces 41a are buried (embedded) in the resin insulation layer 24.

Furthermore, the capacitor connection terminals 42 are disposed within the openings 36 such that their terminal outer surfaces 42a are lower in height than the surface of the resin insulation layer 24. Peripheral portions of the terminal outer surfaces 42a are covered by the outermost resin insulation layer 24. That is, the capacitor connection terminals 42 are greater in size than the openings 36, and peripheral portions of the terminal outer surfaces 42a are buried (embedded) in the resin insulation layer 24.

The IC-chip connection terminals 41 and the capacitor connection terminals 42 are mainly formed by (primarily comprised of) a copper layer. Each of the IC-chip connection terminals 41 and the capacitor connection terminals 42 has a structure in which only portions of the upper surface of the copper layer which portions are aligned with the openings 35 and 36 are covered by plating layers 46 and 47, respectively, the plating layers being formed of a material other than copper (specifically, a nickel-gold plating layer).

A plurality of openings 37 (second openings) are formed in the resin insulation layer 20 (outermost resin insulation layer on the second main surface side of the laminate structure) which is exposed to the outside and serves as an outermost layer on the bottom surface 32 side of the wiring laminate portion 30. The motherboard connection terminals 45 are disposed to correspond to these openings 37.

Specifically, the motherboard connection terminals 45 are disposed within the openings 37 such that their terminal outer surfaces 45a are lower in height than the outer surface of the resin insulation layer 20. Peripheral portions of the terminal outer surfaces 45a are covered by the outermost resin insulation layer 20. That is, the motherboard connection terminals 45 are greater in size than the openings 37, and peripheral portions of the terminal outer surfaces 45a are buried (embedded) in the resin insulation layer 20.

Each of the motherboard connection terminals 45 has a concave portion 45b at a center portion of the terminal outer surface 45a thereof (i.e., the central portion of the outer surface of each of the second-main-surface-side connection terminals has a concave shape). The deepest portion of the concave portion 45b is located on an inner layer (interior) side in relation to the peripheral portion of the terminal outer surface 45a. In the present embodiment, the terminal outer surfaces 45a of the motherboard connection terminals 45 are formed such that the deepest portion of the concave portion 45b is located on the inner layer (interior) side in relation to the inner main surface 20a of the resin insulation layer 20. Notably, although a peripheral edge portion of the concave portion 45b is located at substantially the same position as the inner main surface 20a in the present embodiment, the concave portion 45b may be formed such that the peripheral edge portion of the concave portion 45b is located outward of the inner main surface 20a.

Each of the motherboard connection terminals 45 is rounded along an edge 45d (peripheral edge) of a terminal inner surface 45c.

The motherboard connection terminals 45 are mainly formed by (primarily comprised of) a copper layer. Each of the motherboard connection terminals 45 has a structure in which only portions of the upper surface of the copper layer which portions are aligned with the openings 37 are covered by a plating layer 48 formed of a material other than copper (specifically, a nickel-gold plating layer). A motherboard is connected to the motherboard connection terminals 45 via unillustrated solder.

The thus-configured multilayer wiring substrate 10 is fabricated by, for example, the following procedure.

First, in a build-up step, a support substrate (a glass epoxy substrate or the like) having sufficient strength is prepared. On the support substrate, the resin insulation layers 20 to 24 and the conductive layers 26 are alternately built up, thereby forming the wiring laminate portion 30.

Figure 4:
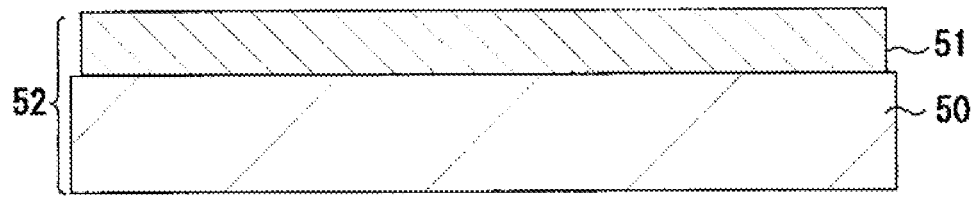
FIG. 4 is an explanatory view showing a method of manufacturing the multilayer wiring substrate according to the first embodiment.

More specifically, as shown in FIG. 4, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51.

Figure 5:
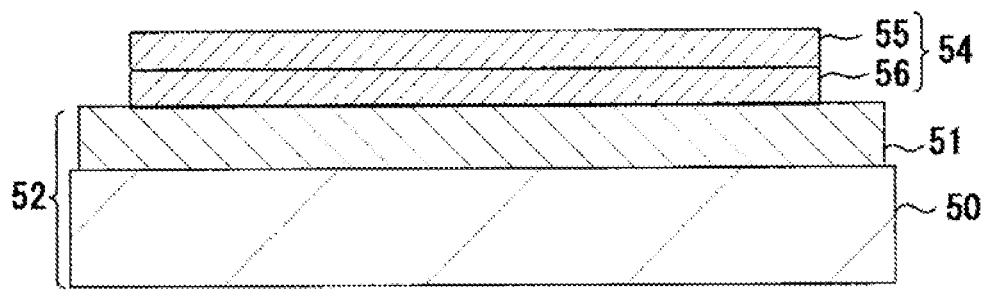
FIG. 5 is an explanatory view showing the method of manufacturing the multilayer wiring substrate according to the first embodiment.

Then, as shown in FIG. 5, a metal laminate sheet 54 is disposed on the upper surface of the ground resin insulation layer 51 of the base material 52 (base-material preparation step). Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 (a pair of metal foils) are separably in close contact with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 6:
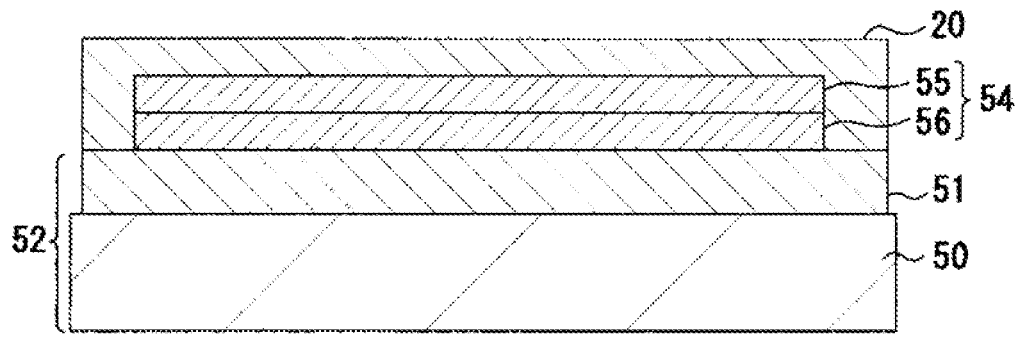
FIG. 6 is an explanatory view showing the method of manufacturing the multilayer wiring substrate according to the first embodiment.

After the base-material preparation step, an insulation-layer/conductor-portion forming step is performed. Specifically, as shown in FIG. 6, the sheet-like resin insulation layer 20 is disposed on and attached onto the base material 52 in such a manner as to cover the metal laminate sheet 54. At this time, the resin insulation layer 20 comes into close contact with the metal laminate sheet 54 and comes into close contact with the ground resin insulation layer 51 in a region around the metal laminate sheet 54, thereby sealing in the metal laminate sheet 54.

Figure 7:
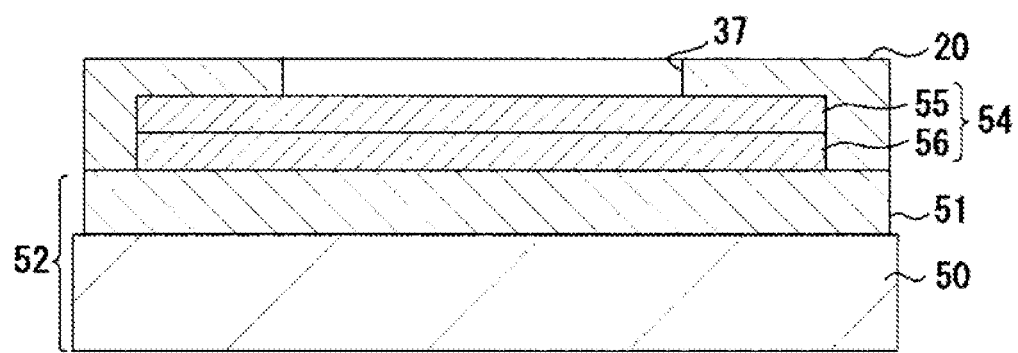
FIG. 7 is an explanatory view showing the method of manufacturing the multilayer wiring substrate according to the first embodiment.

Then, as shown in FIG. 7, the openings 37 are formed in the resin insulation layer 20 at predetermined positions so as to partially expose the copper foil 55, by means of performing laser beam machining by use of, for example, excimer laser, UV laser, or $CO_2$ laser. After that, electroless copper plating is performed so as to form a full-surface plating layer (not shown) which covers the openings 37 and the resin insulation layer 20.

Figure 8:
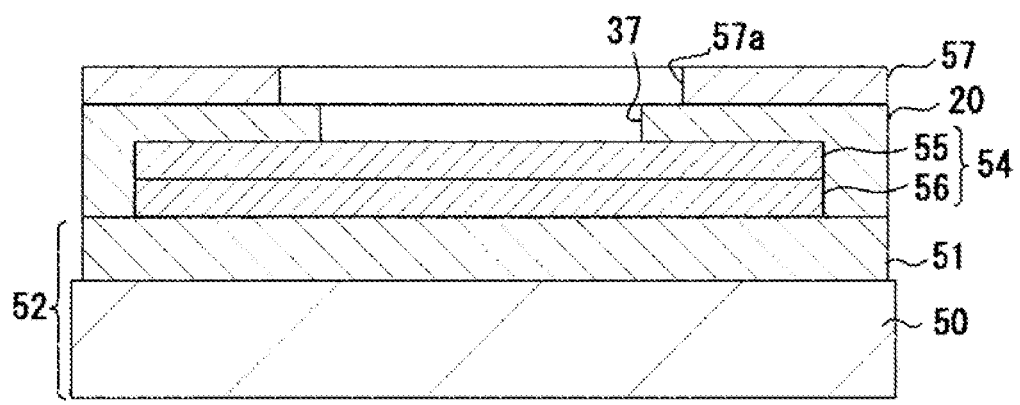
FIG. 8 is an explanatory view showing the method of manufacturing the multilayer wiring substrate according to the first embodiment.

Subsequently, a dry film for forming a plating resist film is laminated on the upper surface of the resin insulation layer 20, and exposure and development are carried out for the dry film. As a result, a plating resist film 57 is formed on the resin insulation layer 20, and additional openings 57a which are greater in area than the openings 37 of the resin insulation layer 20 are formed in the plating resist film 57 at positions corresponding to the openings 37 (see FIG. 8).

Figure 9:
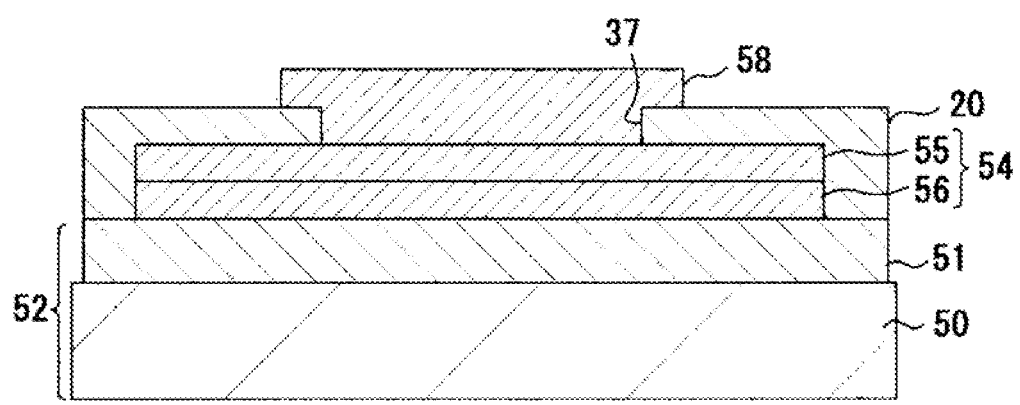
FIG. 9 is an explanatory view showing the method of manufacturing the multilayer wiring substrate according to the first embodiment.

Furthermore, copper electroplating is selectively performed with the plating resist film 57 formed, whereby metal conductor portions 58 are formed on the copper foil 55 of the metal laminate sheet 54. Subsequently, the plating resist film 57 is peeled off (see FIG. 9). Each of the metal conductor portions 58 is formed such that it fills the corresponding opening 37 and covers a portion of the resin insulation layer 20 around the opening 37.

Figure 10:
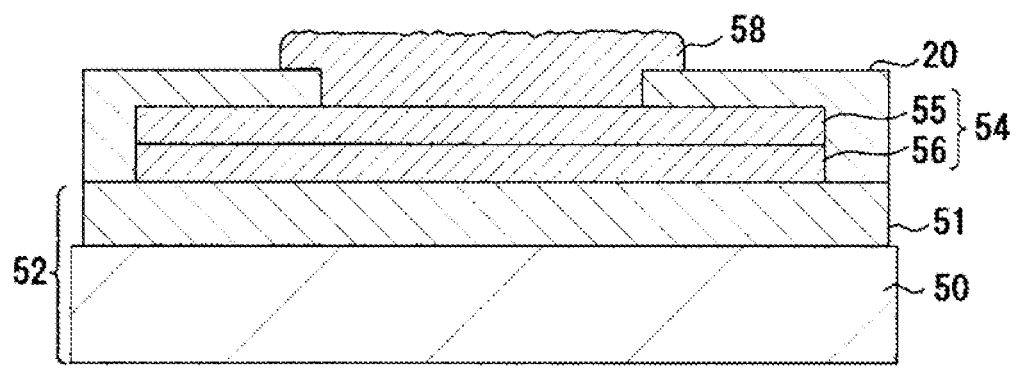
FIG. 10 is an explanatory view showing the method of manufacturing the multilayer wiring substrate according to the first embodiment.
Figure 11:
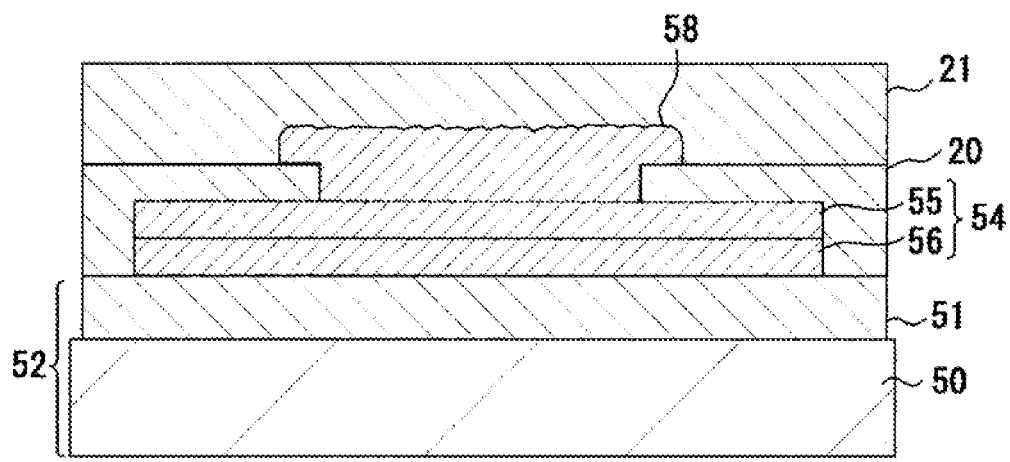
FIG. 11 is an explanatory view showing the method of manufacturing the multilayer wiring substrate according to the first embodiment.

After the insulation-layer/conductor-portion forming step, in order to enhance adhesion between each metal conductor portion 58 and the resin insulation layer 21, the surface of each metal conductor portion 58 is roughened (treatment performed by use of a CZ-series etching agent available from MEC Co., Ltd.) (see FIG. 10). At that time, the surface of each metal conductor portion 58 is roughened, and the edge of the metal conductor portion 58 is rounded. After that, the sheet-like resin insulation layer 21 is disposed on and attached onto the upper surface of the resin insulation layer 20 having the metal conductor portions 58 formed therein (see FIG. 11).

Figure 12:
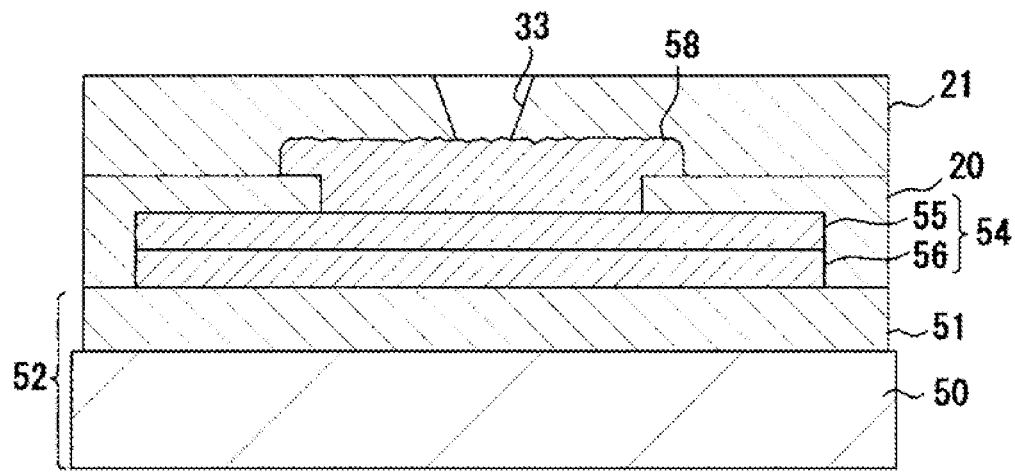
FIG. 12 is an explanatory view showing the method of manufacturing the multilayer wiring substrate according to the first embodiment.

Then, as shown in FIG. 12, the via holes 33 are formed in the resin insulation layer 21 at predetermined positions (positions above the metal conductor portions 58) by means of performing laser beam machining by use of, for example, excimer laser, UV laser, or $CO_2$ laser. Next, by use of etchant, such as a potassium permanganate solution, a desmear step is performed for removing smears from inside the via holes 33. In the desmear step, in place of treatment by use of etchant, plasma asking by use of, for example, $O_2$ plasma may be performed.

Figure 13:
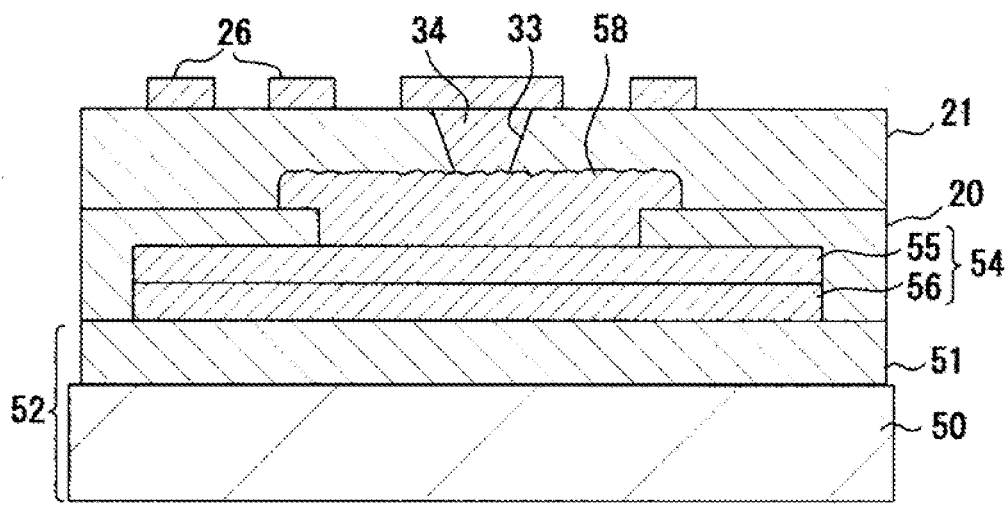
FIG. 13 is an explanatory view showing the method of manufacturing the multilayer wiring substrate according to the first embodiment.

After the desmear step, electroless copper plating and copper electroplating are performed by a known process, thereby forming the via conductors 34 in the via holes 33. Further, etching is performed by a known process (e.g., semi-additive process), thereby forming the conductive layer 26 in a predetermined pattern on the resin insulation layer 21 (see FIG. 13).

Also, other resin insulation layers 22 to 24 and the corresponding conductive layers 26 are formed and laminated on the resin insulation layer 21 by processes similar to those used to form the resin insulation layer 21 and the associated conductive layer 26. Subsequently, laser drilling is performed on the outermost resin insulation layer 24, thereby forming the plurality of openings 35 and 36 (see FIG. 14). Next, there is performed a desmear step of removing smears from inside the openings 35 and 36 by use of, for example, a potassium permanganate solution or $O_2$ plasma.

Figure 14:
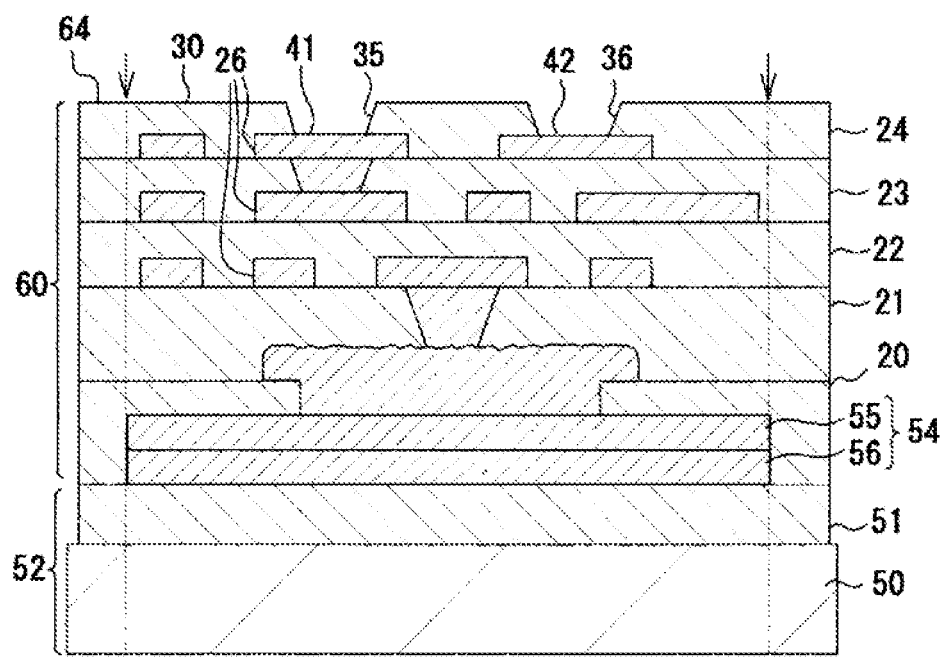
FIG. 14 is an explanatory view showing the method of manufacturing the multilayer wiring substrate according to the first embodiment.

By the above-described build-up step, there is formed a wiring laminate 60 in which the metal laminate sheet 54, the resin insulation layers 20 to 24, and the conductive layers 26 are laminated on the base material 52. Notably, as shown in FIG. 14, a portion of the wiring laminate 60 which is located above the metal laminate sheet 54 will become the wiring laminate portion 30 of the multilayer wiring substrate 10. Furthermore, in the wiring laminate 60, portions of the conductive layer 26 formed between the resin insulation layers 23 and 24 exposed to the outside via the openings 35 will become the IC-chip connection terminals 41, and portions of the conductive layer 26 exposed to the outside via the openings 36 will become the capacitor connection terminals 42.

After the build-up step, the wiring laminate 60 is cut by a dicing apparatus (not shown) so as to remove a surrounding portion around the wiring laminate portion 30 (cutting step). At this time, as shown in FIG. 14, cutting progresses along the boundary (indicated by the arrows in FIG. 14) between the wiring laminate portion 30 and a surrounding portion 64 and along the extension of the boundary for further cutting of the base material 52 (the support substrate 50 and the ground resin insulation layer 51) located under the wiring laminate portion 30. As a result of this cutting, a peripheral edge portion of the metal laminate sheet 54 which has been sealed in the resin insulation layer 20 is exposed. That is, as a result of removal of the surrounding portion 64, a bonded portion between the ground resin insulation layer 51 and the resin insulation layer 20 is lost. Consequently, the wiring laminate portion 30 and the base material 52 are connected together merely through the metal laminate sheet 54.

Figure 15:
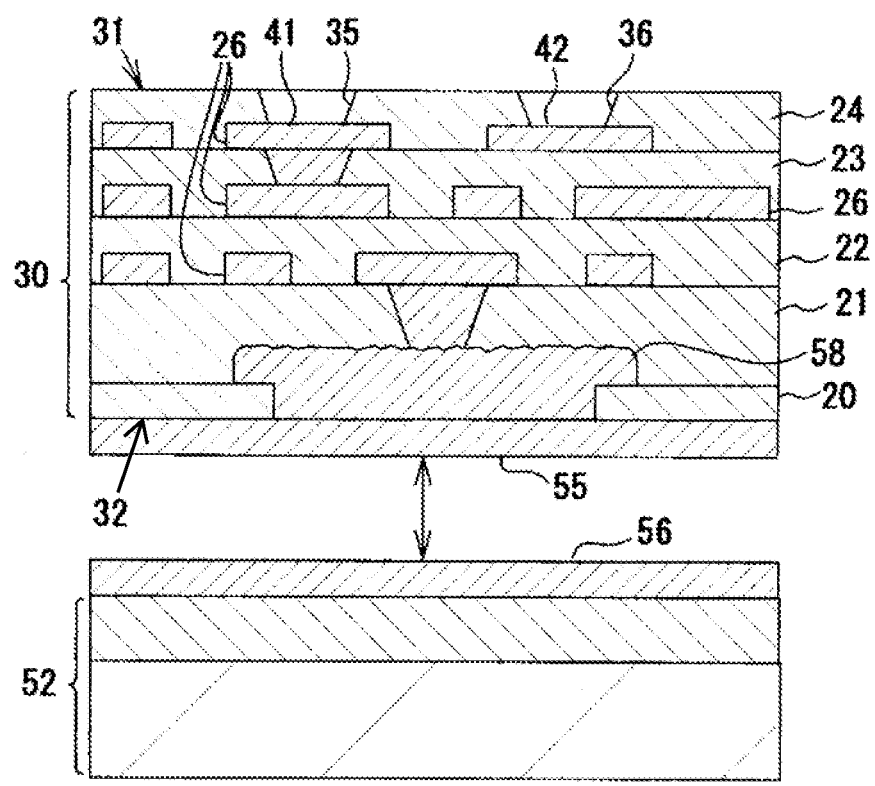
FIG. 15 is an explanatory view showing the method of manufacturing the multilayer wiring substrate according to the first embodiment.

As shown in FIG. 15, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface 32 of the wiring laminate portion 30 (the resin insulation layer 20) (base-material removing step).

Figure 16:
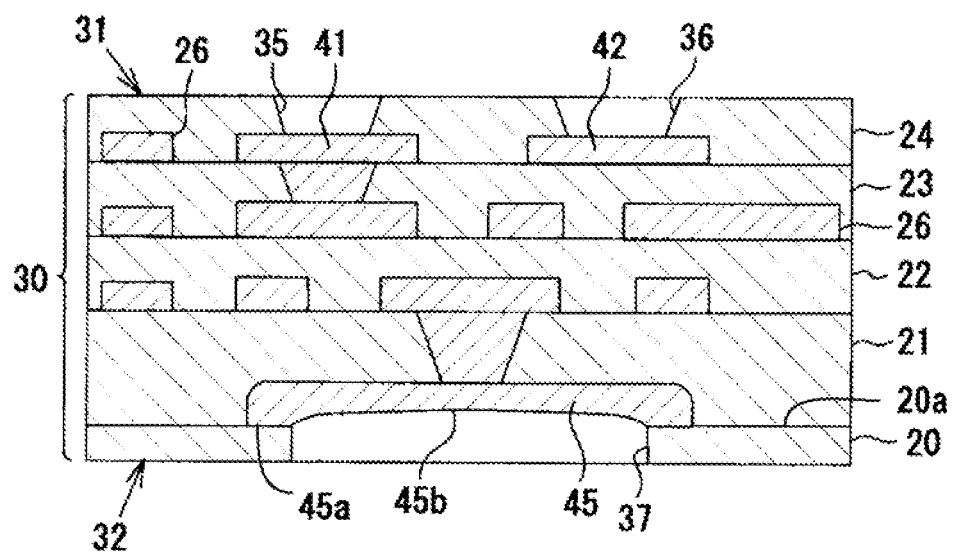
FIG. 16 is an explanatory view showing the method of manufacturing the multilayer wiring substrate according to the first embodiment.

Subsequently, on the bottom surface 32 side of the wiring laminate portion 30, the copper foil 55 is removed, and the metal conductor portions 58 are partially removed, whereby the motherboard connection terminals 45 having the concave portions 45b are formed (connection-terminal forming step). Specifically, a dry film for forming an etching resist film is laminated on the top surface 31 of the wiring laminate portion 30, and exposure and development are performed for the dry film to thereby form an etching resist film which covers the entirety of the top surface 31. In this state, etching is performed for the wiring laminate portion 30 so as to remove the entire copper foil 55 and remove lower portions of the metal conductor portions 58. As a result, the openings 37 are formed in the resin insulation layer 24, and the metal conductor portions 58 remaining in the openings 37 become the motherboard connection terminals 45 (see FIG. 16). Furthermore, at that time, within each opening 37, each metal conductor portion 58 is removed through etching more efficiently at a central portion thereof, as compared with a peripheral portion thereof, whereby the concave portion 45b is formed on the terminal outer surface 45a of each motherboard connection terminal 45. Notably, the degree of formation of the concave portion 45b of the terminal outer surface 45a is adjusted by changing etching conditions such as the concentration and temperature of etchant, treatment time, etc.

Subsequently, electroless nickel plating and electroless gold plating are sequentially performed on the surfaces of the IC-chip connection terminals 41, the surfaces of the capacitor connection terminals 42, and the surfaces of the motherboard connection terminals 45, thereby forming the nickel-gold plating layers 46, 47, and 48 (plating step). By going through the above-mentioned steps, the multilayer wiring substrate 10 of FIG. 1 is manufactured.

Therefore, the present embodiment can yield the following effects.

(1) In the multilayer wiring substrate 10 of the present embodiment, the plurality of resin insulation layers 20 to 24, which constitute the wiring laminate portion 30, are formed of the same build-up material made primarily of a hardened resin insulation material that is not photocurable. In this case, the influence of the difference in thermal expansion coefficient in the wiring laminate portion 30 can be mitigated as compared with the case where the outermost resin insulation layers 20 and 24 are formed of a different resin insulation material. As a result, warpage of the multilayer wiring substrate 10 can be restrained. Moreover, the outermost resin insulation layers 20 and 24, in which the connection terminals 41, 42, and 45 are formed, are formed of the same build-up material having excellent electrical insulation performance as that used to form the inner resin insulation layers 21 to 23. Thus, the interval between the IC-chip connection terminals 41, that between the capacitor connection terminals 42, and that between the motherboard connection terminals 45 can be narrowed, so that the multilayer wiring substrate 10 can be further integrated.

(2) In the multilayer wiring substrate 10 of the present embodiment, the plurality of openings 35 and 36 are formed in the resin insulation layer 24, which is exposed to the outside and serves as an outermost layer on the top surface 31 side of the wiring laminate portion 30, and the plurality of IC-chip connection terminals 41 and the plurality of capacitor connection terminals 42 are disposed to correspond to the respective openings 35 and 36. Peripheral portions of the terminal outer surface 41a and 42a of the connection terminals 41 are 42 are covered by the outermost resin insulation layer 24. That is, the connection terminals 41 and 42 are buried (embedded) in the outermost resin insulation layer 24. Accordingly, the strength of the connection terminals 41 and 42 can be increased sufficiently. Furthermore, the plurality of openings 37 are formed in the resin insulation layer 20, which is exposed to the outside and serves as an outermost layer on the bottom surface 32 side of the wiring laminate portion 30, and the plurality of motherboard connection terminals 45 are disposed to correspond to the openings 37. Peripheral portions of the terminal outer surfaces 45a of the motherboard connection terminals 45 are covered by the outermost resin insulation layer 20. That is, the motherboard connection terminals 45 are buried (embedded) in the outermost resin insulation layer 20. Accordingly, the strength of the motherboard connection terminals 45 can be increased sufficiently. When the connection terminals 41, 42, and 45 are formed in this manner, stress acting at the boundary between each of the connection terminals 41, 42, and 45 and the resin insulation layer 20 or 24 can be mitigated. Furthermore, since the boundary is not straight, various chemicals and the like are less likely to soak into the interior of the substrate via the boundary. As a result, the possibility of generation of cracks in the resin insulation layers 20 and 24 decreases, and the multilayer wiring substrate 10 has an improved reliability as compared with conventional ones.

(3) In the multilayer wiring substrate 10 of the present embodiment, each of the plurality of the motherboard connection terminals 45 has the concave portion 45b at the center of the terminal outer surface 45a thereof, and the deepest portion of the concave portion 45b is located on the inner layer (interior) side in relation to the peripheral portion of the terminal outer surface 45a. Since the motherboard connection terminals 45 formed in this manner increase the area of contact between solder and the terminal outer surface 45a, the strength of solder connection can be increased.

(4) In the multilayer wiring substrate 10 of the present embodiment, the terminal inner surface 45c of each motherboard connection terminal 45 is rounded along the edge 45d thereof. Since this rounding eliminates the concentration of stress at edge portions of the motherboard connection terminals 45, the possibility of generation of cracks in the resin insulation layer 20 decreases, and the multilayer wiring substrate 10 has an improved reliability as compared with conventional ones.

(5) In the multilayer wiring substrate 10 of the present embodiment, on the top surface 31 side of the wiring laminate portion 30, two types of connection terminals; i.e., the IC-chip connection terminals 41, to which an IC chip is connected, and the capacitor connection terminals 42, to which chip capacitors are connected and which is larger in area than the IC-chip connection terminals 41, are present as the plurality of first-main-surface-side connection terminals. In this case, an IC chip can be reliably connected to the IC-chip connection terminals 41, which are small in area, and chip capacitors can be reliably connected to the capacitor connection terminals 42, which are large in area. Moreover, since the motherboard connection terminals 45, which are larger in area than the connection terminals 41 and 42 provided on the top surface 31 side, are present on the bottom surface 32 side of the wiring laminate portion 30, the connection terminals 45 can be reliably connected to a motherboard.

(6) In the present embodiment, after the metal conductor portions 58, which are to become the motherboard connection terminals 45, are formed in a predetermined pattern, the inner conductive layers 26 of the wiring laminate portion 30 are laminated. Therefore, positional shift between the motherboard connection terminals 45 and the inner conductive layers 26 can be prevented. Moreover, since the motherboard connection terminals 45 are not required to be formed in a predetermined pattern after the base-material removing step, the multilayer wiring substrate 10 can be manufactured relatively easily.

Second Embodiment

Next, a second embodiment of the present invention will be described with reference to the drawings. The present embodiment differs from the first embodiment in the insulation-layer/conductor-portion forming step of the method of manufacturing the multilayer wiring substrate 10. Notably, the structure of the multilayer wiring substrate 10 is identical with that of the first embodiment.

A method of manufacturing the multilayer wiring substrate 10 of the present embodiment will now be described.

In the insulation-layer/conductor-portion forming step of the present embodiment, each metal conductor portion 58, which is to become a motherboard connection terminal 45, has a lower layer having a small area and an upper layer having a large area, and the lower and upper layers are formed in different steps.

Specifically, as in the first embodiment, after the base-material preparation step (see FIG. 5), electroless copper plating is performed so as to form a full-surface plating layer (not shown) which covers the metal laminate sheet 54 and the base material 52.

Figure 17:
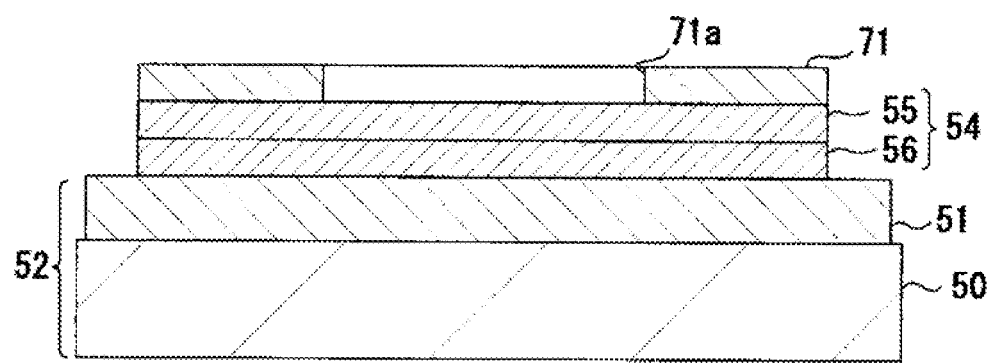
FIG. 17 is an explanatory view showing a method of manufacturing a multilayer wiring substrate according to a second embodiment.

Subsequently, a dry film for forming a plating resist film is laminated on the upper surface of the metal laminate sheet 54, and exposure and development are carried out for the dry film. As a result, a plating resist film 71 having openings 71a at positions corresponding to the motherboard connection terminals 45 is formed (see FIG. 17).

Figure 18:
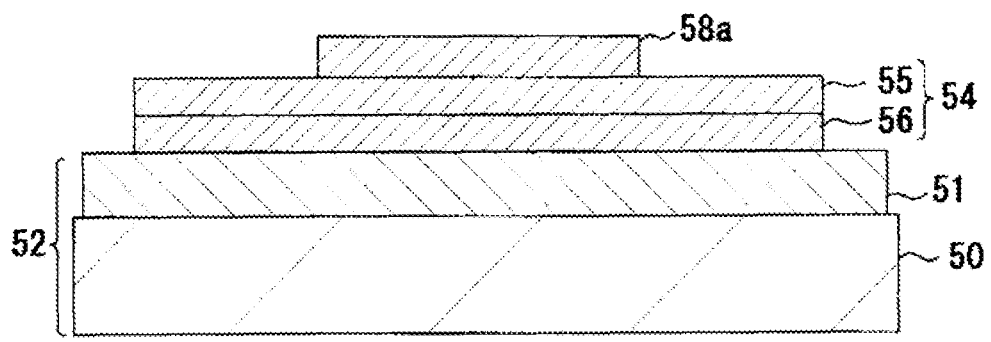
FIG. 18 is an explanatory view showing the method of manufacturing the multilayer wiring substrate according to the second embodiment.

Subsequently, copper electroplating is selectively performed with the plating resist film 71 formed, whereby metal-conductor-portion lower layers 58a, which constitute portions of the metal conductor portions 58, are formed on the metal laminate sheet 54. The plating resist film 71 is then peeled off (see FIG. 18). Furthermore, in order to enhance adhesion between the resin insulation layer 20 and the metal-conductor-portion lower layers 58a, the surfaces of the metal-conductor-portion lower layers 58a are roughened (treatment performed by use of a CZ-series etching agent available from MEC Co., Ltd.).

Figure 19:
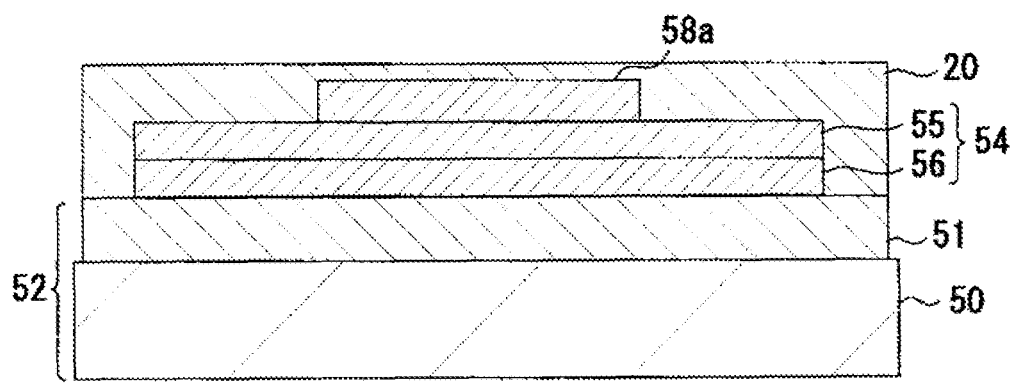
FIG. 19 is an explanatory view showing the method of manufacturing the multilayer wiring substrate according to the second embodiment.

After that, the sheet-like resin insulation layer 20 is disposed on and attached onto the metal laminate sheet 54 having the metal-conductor-portion lower layers 58a, in such a manner to cover the metal laminate sheet 54 (see FIG. 19). The resin insulation layer 20 comes into close contact with the metal laminate sheet 54 and the metal-conductor-portion lower layers 58a, and comes into close contact with the ground resin insulation layer 51 in a region around the metal laminate sheet 54, thereby sealing in the metal laminate sheet 54.

Figure 20:
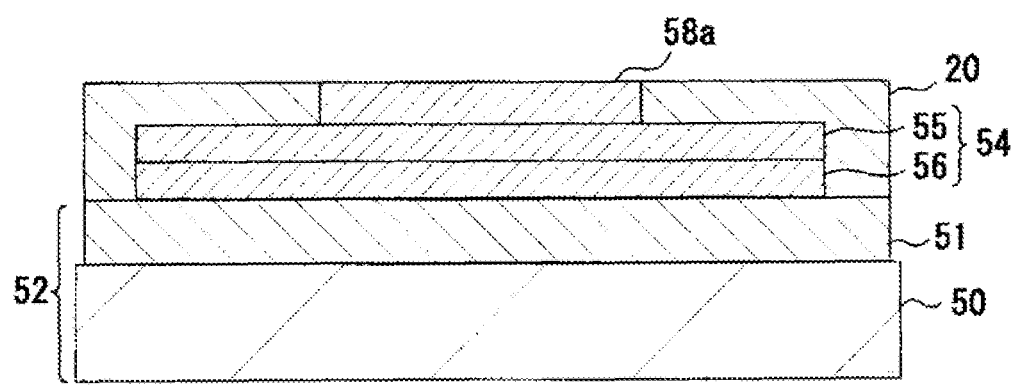
FIG. 20 is an explanatory view showing the method of manufacturing the multilayer wiring substrate according to the second embodiment.

Subsequently, the upper end surfaces of the metal-conductor-portion lower layers 58a are exposed from the resin insulation layer 20 by means of performing, for example, buffing (see FIG. 20). After that, by use of etchant, such as a potassium permanganate solution, a desmear step is performed for removing smears on the metal-conductor-portion lower layers 58a.

Figure 21:
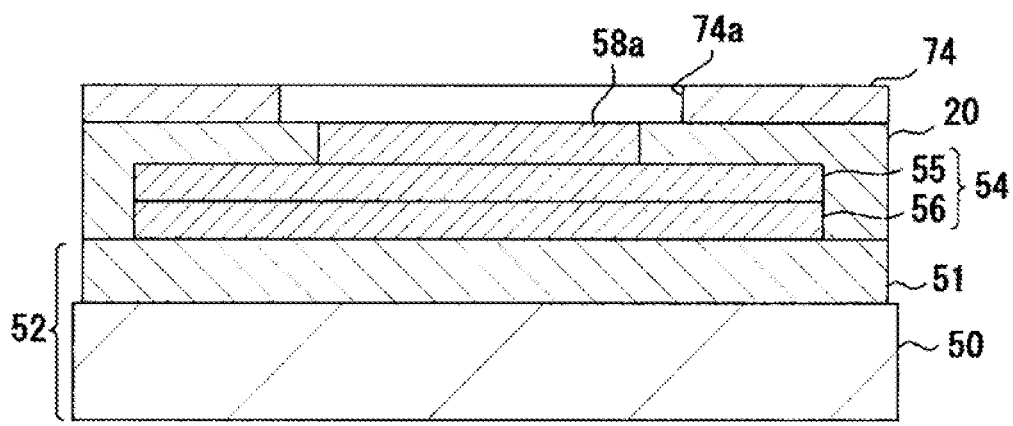
FIG. 21 is an explanatory view showing the method of manufacturing the multilayer wiring substrate according to the second embodiment.

After the desmear step, electroless copper plating is performed so as to form a full-surface plating layer (not shown) which covers the resin insulation layer 20 and the upper end surfaces of the metal-conductor-portion lower layers 58a. Subsequently, a dry film for forming a plating resist film is laminated on the upper surface of the resin insulation layer 20, and exposure and development are carried out for the dry film. As a result, there is formed a plating resist film 74 having openings 74a at positions corresponding to the upper end surfaces of the metal-conductor-portion lower layers 58a, the openings 74a being greater in area than the upper end surfaces (see FIG. 21).

Figure 22:
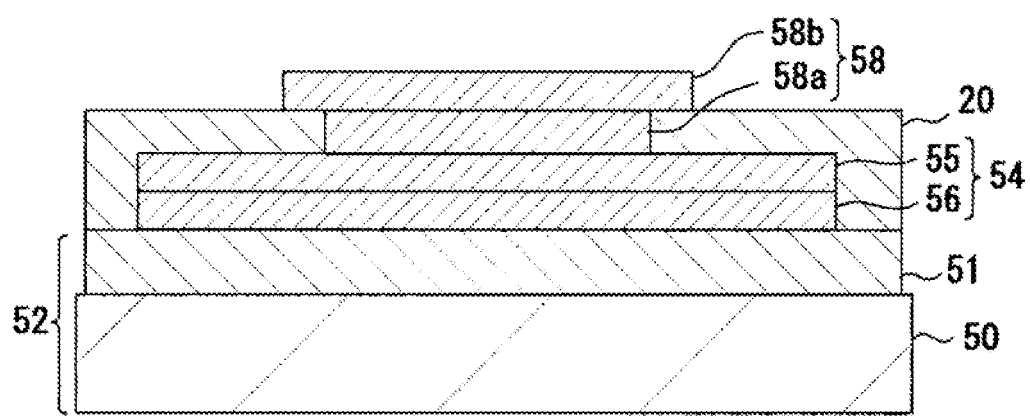
FIG. 22 is an explanatory view showing the method of manufacturing the multilayer wiring substrate according to the second embodiment.

Subsequently, copper electroplating is selectively performed with the plating resist film 74 formed, whereby metal-conductor-portion upper layers 58b, which constitute portions of the metal conductor portions 58, are formed in the openings 74a. The plating resist film 74 is then peeled off (see FIG. 22). After that, etching is performed so as to remove the full-surface plating layer (not shown). Through the above-described steps, the metal conductor portions 58 composed of the metal-conductor-portion lower layers 58a and metal-conductor-portion upper layers 58b are formed.

Figure 23:
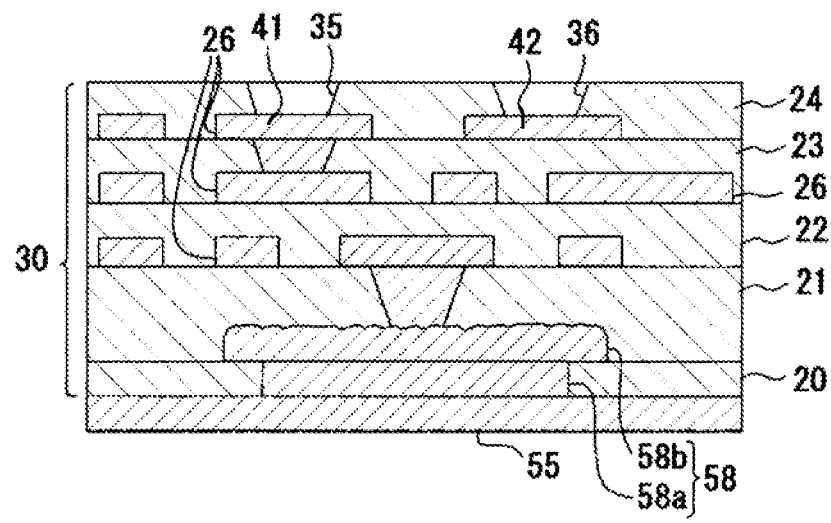
FIG. 23 is an explanatory view showing the method of manufacturing the multilayer wiring substrate according to the second embodiment.

After the insulation-layer/conductor-portion forming step, surface roughening treatment is performed so as to roughen the surface of each metal conductor portion 58, and round the edge of each metal conductor portion 58 (the upper end surface of the metal-conductor-portion upper layer 58b). Subsequently, as in the case of the first embodiment, the build-up step is performed, and the cutting step is then performed. As a result, there is obtained the wiring laminate portion 30, in which the plurality of resin insulation layers 20 to 24 and the plurality of conductive layers 26 are marinated in multilayer arrangement (see FIG. 23).

After the cutting step, on the bottom surface 32 side of the wiring laminate portion 30, the copper foil 55 is removed, and the metal conductor portions 58 are partially removed, whereby the motherboard connection terminals 45 having the concave portions 45b are formed (connection-terminal forming step). Notably, at that time, the metal-conductor-portion lower layers 58a are completely removed, and the metal-conductor-portion upper layers 58b are partially removed. As a result, each of the concave portions 45b is formed such that the deepest portion is located on the inner layer (interior) side in relation to the inner main surface 20a of the resin insulation layer 20, and the remaining portion of the metal-conductor-portion upper layer 58b serves as the motherboard connection terminal 45. After that, in the plating step, the plating layers 46, 47, and 48 are formed on the surfaces of the IC-chip connection terminals 41, the surfaces of the capacitor connection terminals 42, and the surfaces of the motherboard connection terminals 45, whereby the multilayer wiring substrate 10 shown in FIG. 1 is manufactured.

Even in the case where the multilayer wiring substrate 10 is manufactured as in the present embodiment, effects similar to those attained by the first embodiment can be attained.

Notably, the embodiments of the present invention may be modified as follows.

Figure 24:
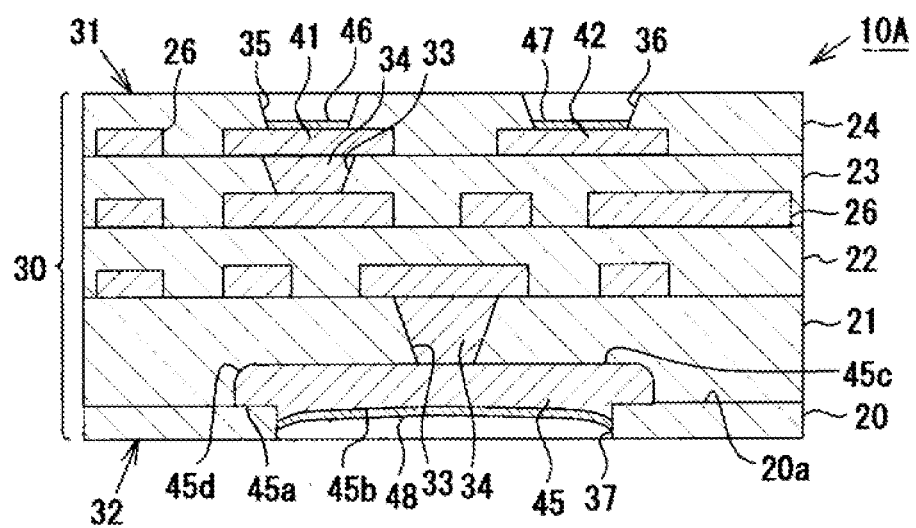
FIG. 24 is a sectional view schematically showing the structure of a multilayer wiring substrate according to another embodiment.

In the multilayer wiring substrate 10 according to embodiments, the concave portion 45b is formed on the terminal outer surface 45a of each motherboard connection terminal 45 such that the deepest portion is located on the inner layer (interior) side in relation to the inner main surface 20a of the resin insulation layer 20. However, the configuration of the concave portion 45b is not limited thereto. As in a multilayer wiring substrate 10A shown in FIG. 24, the concave portion 45b may be formed such that the deepest portion is located outward of the inner main surface 20a of the resin insulation layer 20.

Figure 25:
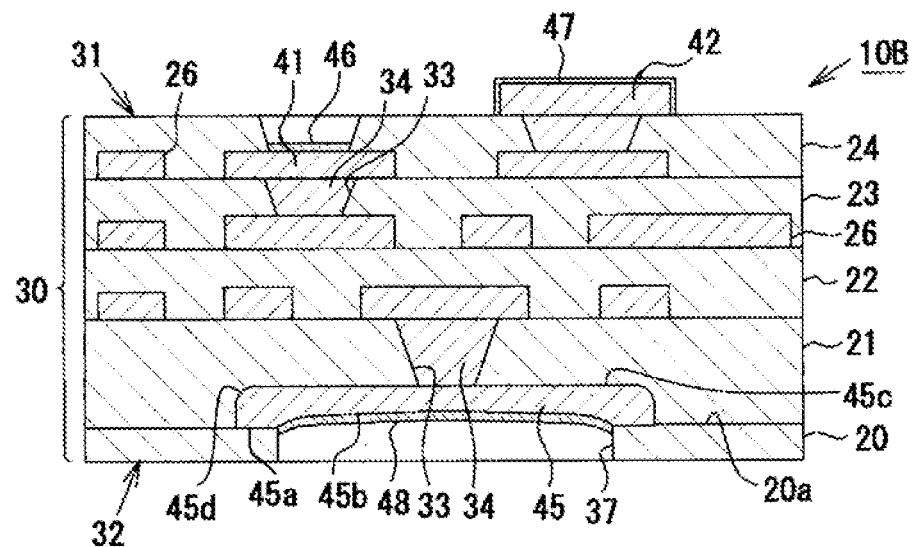
FIG. 25 is a sectional view schematically showing the structure of a multilayer wiring substrate according to another embodiment.
Figure 26:
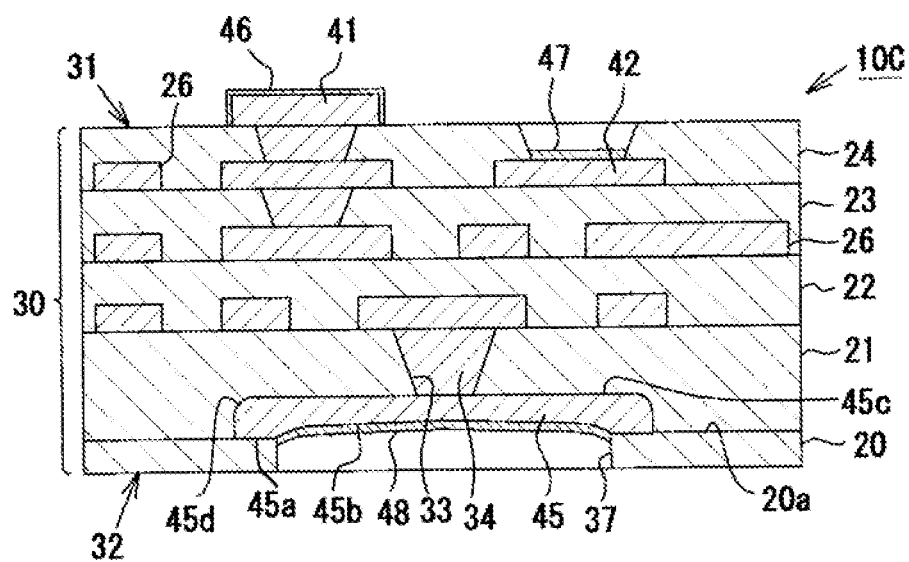
FIG. 26 is a sectional view schematically showing the structure of a multilayer wiring substrate according to another embodiment.

In the multilayer wiring substrate 10 according to embodiments, the IC-chip connection terminals 41 and the capacitor connection terminals 42 (first-main-surface-side connection terminals) are formed such that they are covered by the outermost resin insulation layer 24, and have the same height. However, the configuration of the connection terminals 41 and 42 are not limited thereto. For example, as in a multilayer wiring substrate 10B shown in FIG. 25, the capacitor connection terminals 42 may be formed such that they project from the outermost resin insulation layer 24. Notably, in the multilayer wiring substrate 10B, the upper and side surfaces of each capacitor connection terminal 42 are covered with the plating layer 47. Furthermore, as in a multilayer wiring substrate 10C shown in FIG. 26, the IC-chip connection terminals 41 may be formed such that they project from the outermost resin insulation layer 24. In this multilayer wiring substrate 10C, the upper and side surfaces of each IC-chip connection terminal 41 are covered with the plating layer 46. In the case where the IC-chip connection terminals 41 and the capacitor connection terminals 42 are rendered different in height as in the multilayer wiring substrates 10B and 10C shown in FIGS. 25 and 26, components (IC chips and chip capacitors) of different types can be reliably connected to the connection terminals 41 and 42.

Figure 27:
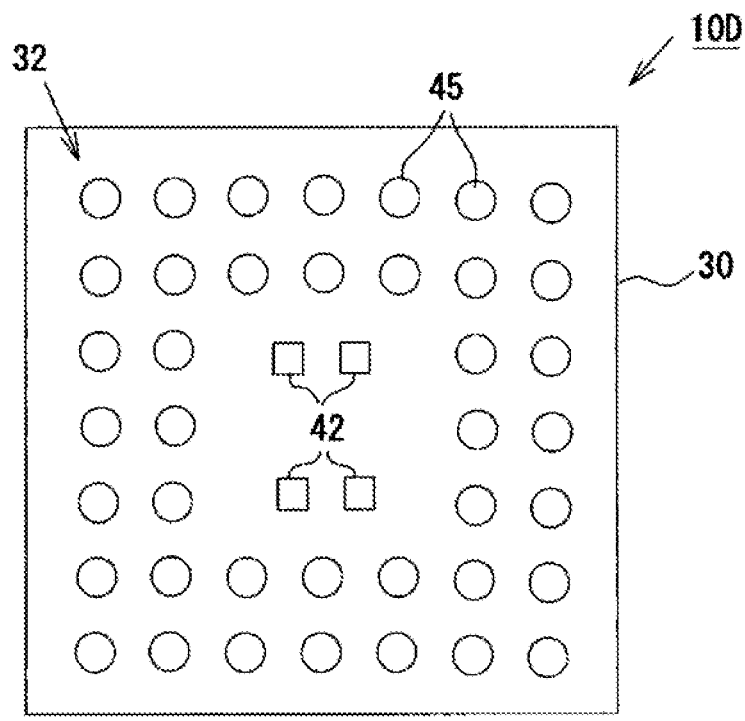
FIG. 27 is a sectional view schematically showing the structure of a multilayer wiring substrate according to another embodiment.
Figure 28:
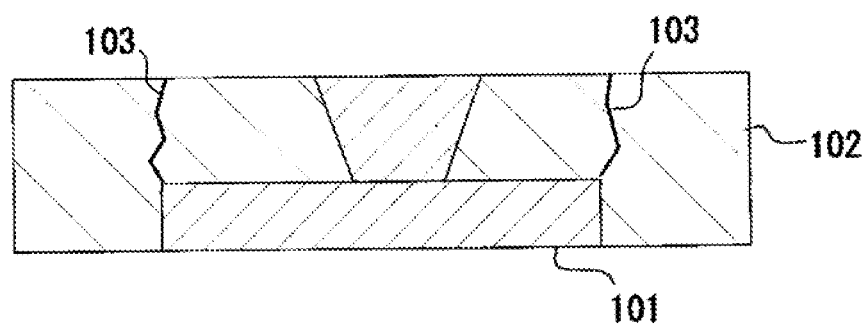
FIG. 28 is an enlarged sectional view showing a conventional multilayer wiring substrate.

In the multilayer wiring substrates 10 and 10A to 10C, two types of connection terminals; i.e., the IC-chip connection terminals 41 and the capacitor connection terminals 42, are provided on the top surface 31 side (first main surface side) of the wiring laminate portion 30 as the first-main-surface-side connection terminals; and the motherboard connection terminals 45 are provided on the bottom surface 32 side (second main surface side) of the wiring laminate portion 30 as the second-main-surface-side connection terminals. However, the arrangement of the connection terminals is not limited thereto. Specifically, as in a multilayer wiring substrate 10D shown in FIG. 27, two types of connection terminals; i.e., the capacitor connection terminals 42 and the motherboard connection terminals 45, may be provided on the bottom surface 32 side of the wiring laminate portion 30 as the second-main-surface-side connection terminals. Notably, in this multilayer wiring substrate 10D, only the IC-chip connection terminals 41 are provided on the top surface 31 of the wiring laminate portion 30 as the first-main-surface-side connection terminals.

In the above-described second embodiment, in the insulation-layer/conductor-portion forming step, buffing is performed so as to expose the upper end surfaces of the metal-conductor-portion lower layers 58a from the resin insulation layer 20. However, the method of exposing the upper end surfaces of the metal-conductor-portion lower layers 58a is not limited thereto. The upper end surfaces of the metal-conductor-portion lower layers 58a may be exposed from the resin insulation layer 20 by performing surface polishing, other than buffing, or machining by use of a laser or plasma.

In the above-described embodiments, the plurality of conductive layers 26 formed in the plurality of resin insulation layers 21 to 24 are connected with one another through the via conductors 34 whose diameters increase in a direction from the bottom surface 32 to the top surface 31. However, their structures are not limited thereto. The via conductors 34 formed in the plurality of resin insulation layers 21 to 24 may have any shape so long as their diameters increase in the same direction; and the plurality of conductive layers 26 may be connected with one anther through via conductors whose diameters increase in a direction from the top surface 31 to the bottom surface 32.

In the above-described embodiment, each of the plating layers 46, 47, and 48, which cover the connection terminals 41, 42, and 45, respectively, is a nickel-gold plating layer. However, the nickel-gold plating layer can be replaced with any other plating layer, such as nickel-palladium-gold plating layer, so long as the plating layer is formed of a material other than copper.

Next, a technical idea that the embodiments described above implement is enumerated below.

(1) A multilayer wiring substrate has a laminate structure in which a plurality of resin insulation layers made primarily of the same resin insulation material, and a plurality of conductive layers are laminated alternately in multilayer arrangement. A plurality of first-main-surface-side connection terminals are disposed on a first main surface of the laminate structure. A plurality of second-main-surface-side connection terminals are disposed on a second main surface of the laminate structure. The plurality of conductive layers are formed in the plurality of resin insulation layers and interconnected by means of via conductors whose diameters increase toward the first main surface or the second main surface. The plurality of resin insulation layers are formed of a hardened resin insulation material that is not photocurable. A plurality of first openings are formed in a resin insulation layer which is exposed to the outside and serves as an outermost layer on the first main surface side of the laminate structure. The first-main-surface-side connection terminals have terminal outer surfaces, and are disposed to correspond to the first openings. The peripheral portions of the terminal outer surfaces are covered by the outermost resin insulation layer. A plurality of second openings are formed in a resin insulation layer which is exposed to the outside and serves as an outermost layer on the second main surface side of the laminate structure. The second-main-surface-side connection terminals have terminal outer surfaces, and are disposed to correspond to the second openings. The peripheral portions of the terminal outer surfaces are covered by the outermost resin insulation layer. Each of the second-main-surface-side connection terminals has a concave portion at the center of the terminal outer surface, and the deepest portion of the concave portion is located on the inner layer (interior) side in relation to a peripheral portion of the terminal outer surface. At least motherboard connection terminals, which are the second-main-surface-side connection terminals, or IC-chip connection terminals and the passive-component connection terminals, which are the first-main-surface-side connection terminals, have a structure in which only the upper surface of a copper layer which mainly forms the connection terminals is covered with a plating layer formed of a material other than copper.

(2) The multilayer wiring substrate described above in (1) is characterized in that each of the motherboard connection terminals, the IC-chip connection terminals, and the passive-component connection terminals has a structure in which only the upper surface of a copper layer which mainly forms the connection terminals is covered with a plating layer formed of a material other than copper.

(3) The multilayer wiring substrate described above in (1) or (2) is characterized in that the terminal outer surface of each second-main-surface-side connection terminal is formed such that the deepest portion of the concave portion is located on the inner layer (interior) side in relation to the inner main surface of the outermost resin insulation layer.

DESCRIPTION OF REFERENCE NUMERALS 10, 10A to 10D: multilayer wiring substrate
20 to 24: resin insulation layer
26: conductive layer
30: wiring laminate portion (laminate structure)
31: top surface (first main surface)
32: bottom surface (second main surface)
34: via conductor
35, 36: opening (first opening)
37: opening (second opening)
41: IC-chip connection terminal
41a: terminal outer surface
42: capacitor connection terminal (passive-component connection terminal)
42a: terminal outer surface
45: motherboard connection terminal
45a: terminal outer surface
45b: concave portion
45c: terminal inner surface
45d: edge
52: base material
55: copper foil (metal foil)
57, 74: plating resist film
57a, 74a: opening
58: metal conductor portion
58a: metal-conductor-portion lower layer
58b: metal-conductor-portion upper layer

What is claimed is:

1. A multilayer wiring substrate comprising a laminate structure in which a plurality of resin insulation layers made primarily of a same resin insulation material, and a plurality of conductive layers are laminated alternately in multilayer arrangement, a plurality of first-main-surface-side connection terminals being disposed on a first main surface side of the laminate structure, a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side of the laminate structure or the second main surface side of the laminate structure, wherein:

the plurality of resin insulation layers are formed of a hardened resin insulation material that is not photocurable;
a plurality of first openings are formed in an outermost resin insulation layer on the first main surface side of the laminate structure;
the plurality of first-main-surface-side connection terminals include terminal outer surfaces and are disposed to correspond to the plurality of first openings, and peripheral portions of the terminal outer surfaces are covered by the outermost resin insulation layer on the first main surface side of the laminate structure;
a plurality of second openings are formed in an outermost resin insulation layer on the second main surface side of the laminate structure;
the plurality of second-main-surface-side connection terminals are disposed to correspond to the plurality of second openings and include terminal inner surfaces and terminal outer surfaces, the terminal inner surfaces including a peripheral edge that is rounded and peripheral portions of the terminal outer surfaces are covered by the outermost resin insulation layer on the second main surface side of the laminate structure;
each of the plurality of second-main-surface-side connection terminals includes a copper layer having a concave portion that extends across the entire portion of the terminal outer surfaces that are exposed from the plurality of second opening; and
a plating layer covering the concave portion of the copper layer.

2. The multilayer wiring substrate according to claim 1, wherein a deepest portion of the concave portion of each of the terminal outer surfaces of the plurality of second-main-surface-side connection terminals is located on an interior side in relation to the peripheral portion of each of the terminal outer surfaces of the plurality of second-main-surface-side connection terminals.

3. The multilayer wiring substrate according to claim 1, wherein the first-main-surface-side connection terminals include IC-chip connection terminals, to which an IC chip is to be connected, and passive-component connection terminals, to which a passive component is to be connected and which are greater in area than the IC-chip connection terminals; and the second-main-surface-side connection terminals include motherboard connection terminals, to which a motherboard is to be connected and which are greater in area than the IC-chip connection terminals and the passive-component connection terminals.

4. The multilayer wiring substrate according to claim 1, wherein the first-main-surface-side connection terminals include IC-chip connection terminals, to which an IC chip is to be connected; and the second-main-surface-side connection terminals include passive-component connection terminals, to which a passive component is to be connected and which are greater in area than the IC-chip connection terminals, and motherboard connection terminals, to which a motherboard is to be connected and which are greater in area than the IC-chip connection terminals and the passive-component connection terminals.

5. The multilayer wiring substrate according to claim 1, wherein the via conductors formed in the plurality of resin insulation layers are shaped such that their diameters increase in a direction from the second main surface side to the first main surface side.

6. The multilayer wiring substrate according to claim 1, wherein the plurality of second-main-surface-side connection terminals include motherboard connection terminals and the plurality of first-main-surface-side connection terminals include IC-chip connection terminals and passive-component connection terminals, and wherein the motherboard connection terminals, the IC-chip connection terminals, and the passive-component connection terminals comprise a copper layer covered with a plating layer comprised of a material other than copper.

7. The multilayer wiring substrate according to claim 1, wherein each of the terminal outer surfaces of the plurality of second-main-surface-side connection terminals is formed such that a deepest portion of the concave portion is located on an interior side in relation to an inner main surface of the outermost resin insulation layer on the second main surface side of the laminate structure.

* * * * *